US006272181B1

(12) United States Patent
Matt

(10) Patent No.: US 6,272,181 B1
(45) Date of Patent: Aug. 7, 2001

(54) METHOD AND DEVICE FOR THE AGGREGATION OF SIGNALS FROM SAMPLING VALUES

(75) Inventor: Hans Jürgen Matt, Remseck (DE)

(73) Assignee: Alcatel, Paris (FR)

( * ) Notice: Subject to any disclaimer, the term of this patent is extended or adjusted under 35 U.S.C. 154(b) by 0 days.

(21) Appl. No.: 09/048,544

(22) Filed: Mar. 26, 1998

(30) Foreign Application Priority Data

Apr. 18, 1997 (DE) ............................................. 197 16 314

(51) Int. Cl.[7] ..................................................... H03M 1/12

(52) U.S. Cl. .......................... 375/242; 375/377; 341/141; 341/155; 348/572; 370/537

(58) Field of Search .................................... 375/216, 214, 375/355, 377, 242; 370/529, 537, 538, 540; 348/584; 341/141, 155

(56) References Cited

U.S. PATENT DOCUMENTS

| | | | |
|---|---|---|---|
| 3,614,521 | 10/1971 | Brueschke . | |
| 3,787,785 * | 1/1974 | Bass | 332/9 R |
| 4,313,195 * | 1/1982 | Lehmann | 370/84 |
| 4,479,212 | 10/1984 | Albanese . | |
| 4,719,618 | 1/1988 | Itoh et al. . | |
| 4,965,797 | 10/1990 | Yamane et al. . | |
| 4,994,899 * | 2/1991 | Rhodes | 358/11 |
| 5,193,000 * | 3/1993 | Lipton et al. | 358/92 |
| 5,208,545 | 5/1993 | Schweitzer, III . | |
| 5,596,647 | 1/1997 | Wakai et al. . | |

FOREIGN PATENT DOCUMENTS

| | | |
|---|---|---|
| 3200934 | 12/1982 | (DE) . |
| 3511023 | 11/1985 | (DE) . |
| 4113119 | 10/1992 | (DE) . |
| 9419712 | 1/1995 | (DE) . |
| 0695066 | 6/1995 | (EP) . |
| 0724341 | 7/1996 | (EP) . |

OTHER PUBLICATIONS

"Semiconductor circuit technology" by Tietze and Schenk, 8th. edition, 1986, pp. 299 and 300, as well as 579 to 581.

* cited by examiner

*Primary Examiner*—Amanda T. Le
(74) *Attorney, Agent, or Firm*—Ware, Fressola, Van Der Sluys & Adolphson LLP

(57) ABSTRACT

A method of forming an aggregation of N>1 band-limited time signals, each with a bandwidth of ≦B, which are present as analog and/or digital sampling values, with a respective sampling frequency of $f_A$>2B, is characterized in that the sampling values of all N time signals are offset in time and superimposed on each other, and are jointly input to a low-pass filter (12) with a bandwidth of B'>B, and that a composite signal is tapped off from the output of the low-pass filter (12). This allows the aggregation to be performed in a considerably shorter calculation time, a number of slow and expensive aggregation elements can possibly be saved, and the damping of the signals during processing can be minimized, as well as the corresponding loss of information.

16 Claims, 5 Drawing Sheets

METHOD AND DEVICE FOR THE AGGREGATION OF SIGNALS FROM SAMPLING VALUES

TECHNICAL FIELD

The invention concerns a method and a device for aggregating N>1 band-limited time signals with a bandwidth of ≦B each, which are present as analog and/or digital sampling values and have a respective sampling frequency of $f_A$>2B. Such a method is known from DE 32 00 934 A1.

BACKGROUND OF THE INVENTION

An aggregation of analog signals by means of adders is described for example in the textbook "Semiconductor circuit technology" by Tietze and Schenk, 8th. edition, 1986, pages 299 and 300 as well as 579 to 581.

The aggregation of digital signals from analog input signals with an intermediate analog-digital converter (ADC) via a digital signal processor (DSP), and a reanalogation of the processed signals by means of a digital-analog converter (DAC), particularly in the area of video signals, is described for example in EP 0 695 066 A2.

A linear aggregation of several band-limited time signals into a new composite signal takes place among other things in audio technology, where audio signals are superimposed by mixing the sounds from several different sources, or in video technology where video signals are combined into a new video signal by cross-fading the images from two different sources. The areas of application for sound mixing are for example in radio, in the disk recording industry and in the production of other sound carriers. Furthermore, sound mixing is required for audio conference circuits, i.e. for the aggregation of several sound signals from different sources in the area of telecommunications. A mixing of images by cross-fading several video signals is usual for example in television, in the production of video disks and video displays on other video carriers, video recorders, camcorders and such. Although no video mixing takes place in video conferences, windows are faded into a joint video for the different participants in the conference system.

With the method for mixing low frequency signals known from the DE 32 00 934 A1 cited in the beginning, which are present in the form of digital scanning samples, the pulses intended for the common terminal, which must be rendered jointly audible in the respective terminal, are aggregated by an analog adder and are transmitted within one time frame in the form of an aggregate pulse which controls the terminal during the entire time frame.

A disadvantage of the known methods is the relatively long calculation time for the aggregation of the individual signals by a digital computer, or by a hardware circuit of adding units. In addition there is considerable damping of the signals and thus a loss of information when converting from analog to digital signals and vice versa during the reanalogation of the added signals in the case of a digital aggregation.

SUMMARY OF THE INVENTION

The object of the present invention is therefore to improve a method of the kind cited in the beginning in a way so that the aggregation can be carried out in a considerably shorter calculation time, so that possibly a number of slow and expensive adder elements can be saved, and minimizing the damping of the signals during the processing and thus the corresponding loss of information.

The invention achieves this object in as surprising as well as an effective a manner in that the sampling values of all N time signals are offset in time and superimposed on each other, and are jointly input to a low-pass filter with a bandwidth of B'>B, and that a composite signal is tapped off from the output of the low-pass filter.

In contrast to the known methods, in which signals from different sources that are present as analog or digital sampling values are converted separately for each signal into analog signals, which are aggregated by means of one or several analog adders or by a digital processor, in the method of the invention the sampling values of different time signals are offset in time and superimposed on each other, and converted to analog by means of a passive low-pass filter. The sampling values of different signals, each of which was sampled at a frequency $f_A$, are combined by means of a time-division multiplex method into a superimposed signal with the frequency of $N \cdot f_A$. During the subsequent filtration with a low-pass filter of the bandwidth $B'=f_A/2$, an analog composite signal is generated, which can be sampled for further processing at the frequency of $f_A$.

On the one hand this results in a qualitatively better and faster aggregation, on the other the aggregation can be achieved in a more cost-effective manner due to the saving of an adder unit or a corresponding processor for the digital aggregation of the input signals. Another advantage is that a device which is suitable for carrying out the method of the invention can be integrated in a simple manner into an integrated switching circuit, for example a VLSI chip. On the other hand the method of the invention can easily be built into a DSP software, with the corresponding gain in calculation time. The method of the invention is suitable for adding both digital as well as analog input values.

Particularly preferred is a configuration of the method of the invention in which the sampling values of the N time signals are offset from each other equidistantly in time. This allows from the outset to establish a rigid and always known time-relation of the signals from different sources, which remains the same.

Another preferred configuration of the invention provides for the sampling values, which are offset in time with respect to each other, to be input into the low-pass filter at a clock frequency of $N \cdot f_A$.

When analog sampling values are input in another advantageous configuration of the invention, an analog low-pass filter can be used, whose output has a time-continuous composite signal and causes the formation of a perfect aggregation of the partial signals.

Preferably this method is developed further in that analog sampling values are obtained by sampling the time-continuous composite signal.

As an alternative, other configurations into which digital sampling values are input provide for the use of a digital low-pass filter which operates at the clock frequency of $n \cdot f_A$, whose output has a composite signal with $n \cdot f_A$ sampling values per unit, i.e. in oversampled form. This allows to utilize all the advantages of an oversampling method.

A further development of this configuration provides for the oversampled composite signal to be input into a digital-analog (D/A) converter which operates at the clock frequency of $N \cdot f_A$, and whose output signal produces the time-continuous composite signal via subsequent filtration, preferably by means of a resistor-capacitor (RC) element. Instead of the expensive filter installation, a very simple cost-effective RC filter element can be used which, because of the oversampling, ensures sufficient suppression of the mirror signals that periodically occur in the frequency space in accordance with a Fourier transformation.

A further development is particularly advantageous, whereby the oversampled composite signal is transferred to a lower sampling frequency $i \cdot f_A < N \cdot f_A$, where preferably i=1, by periodically omitting sampling values (=decimation). Inversely, a higher sampling frequency can also be achieved by means of sampling rate conversion, by introducing fictitious sampling values "0" in intermediate areas, where low-pass filtration produces a perfect total signal at the end.

The method of the invention can be carried out in a particularly simple and inexpensive manner with analog input values, if the aggregation and the low-pass filtration are performed with a digital signal processor.

The framework of the present invention also includes a device for aggregating N>1 band-limited time signals, each with a bandwidth ≦B, which are present as analog and/or digital sampling values, where the respective sampling frequency is $f_A > 2B$, and a time-division multiplex unit is provided in which the sampling values of all N time signals can be offset in time and superimposed on each other, and a low-pass filter with a bandwidth of B'>B is connected to the time-division multiplex unit into which the superimposed time-offset sampling values can be input jointly, and a composite signal can be tapped off from its output.

Further advantages of the invention can be found in the description and the drawing. The above-cited features of the invention and those listed further on can be applied individually or in any type of combination. The indicated and described configurations must not be taken as a final enumeration, but they rather have a more exemplary character for the portrayal of the invention.

BRIEF DESCRIPTION OF THE DRAWINGS

The invention is illustrated in the drawing and will be explained in greater detail by means of embodiments.

BEST MODE FOR CARRYING OUT THE INVENTION

Figure 1:
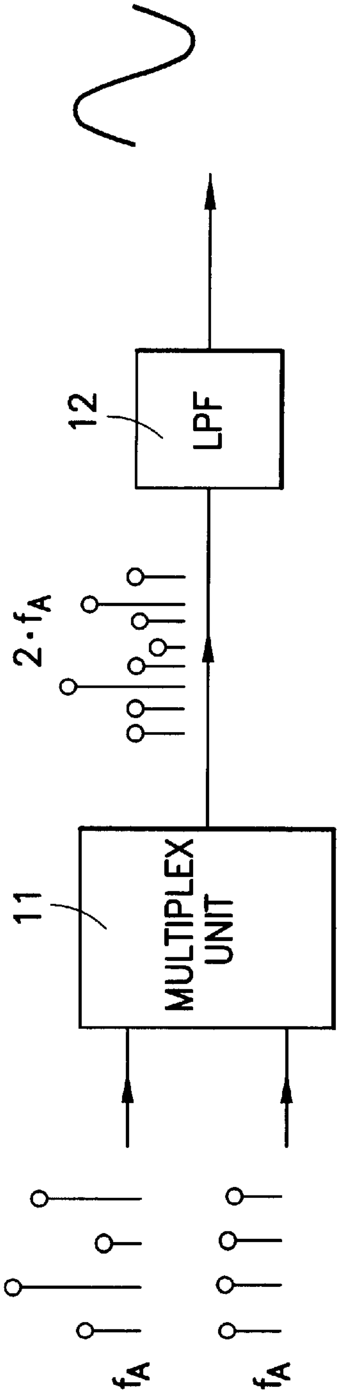
FIG. 1 is a schematic illustration of a device for carrying out the method of the invention, with indicated sampling signals.

FIG. 1 illustrates a particularly simple structure for forming an aggregation of time signals according to the invention, where the respective time signals are input as sampling values with a sampling frequency $f_A$. In that case the sampling frequency $f_A$ must be larger or at least equal to twice the bandwidth of the band-limited time signals.

The time signals from both sources are input into a time-division multiplex unit 11, in which they are offset in time and superimposed on each other. It is an advantage if the sampling values of the time signals are equidistant in time, so that with the present example sampling values with a frequency of $2 \cdot f_A$ emerge from the time-division multiplex unit 11. These are input into a low-pass filter 12 with a bandwidth B'>B. The desired composite signal can be tapped off from the output of the low-pass filter 12.

Figure 2:
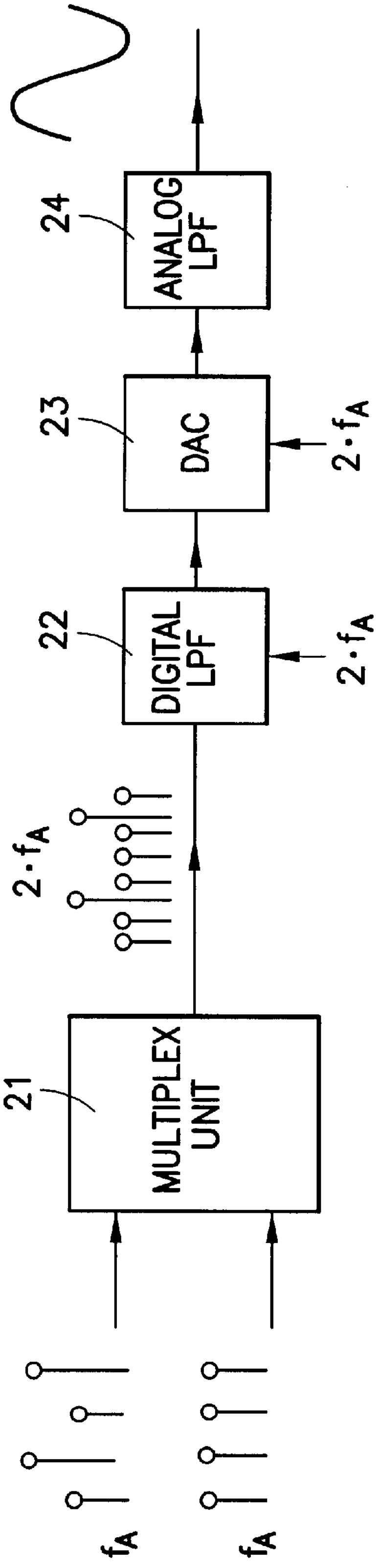
FIG. 2 is an improved configuration of the device in FIG. 1.

An improved configuration for the processing of digital input data is schematically illustrated in FIG. 2. In that case the digital sampling values, which in the present example originate once again from two sources only, are input into the time-division multiplex unit 21, in which a preferably equidistant time-offset takes place once again. The superimposed time-offset signals are then routed to a digital low-pass filter 22, which is clocked at a frequency of $2 \cdot f_A$ in the present example. Since the digital low-pass filter 22 always produces periodic continuations of the signals which are not desirable, the composite signals, after they have passed through a digital-analog converter (DAC) 23, are routed to a further but analog low-pass filter 24 which allows the small frequency portions of the produced signals to pass through the frequency space, and dampens the higher frequencies enough to suppress the undesirable periodic signal artifacts. In the present example, the DAC 23 as well as the digital low-pass filter 22 are clocked at a frequency of $2 \cdot f_A$, since only signals from two different sources must be processed, which are equidistantly offset with respect to each other in the time-division multiplex unit 21. The analog low-pass filter 24 may be an inexpensive RC element or can be made up of several of them.

Figure 3A:
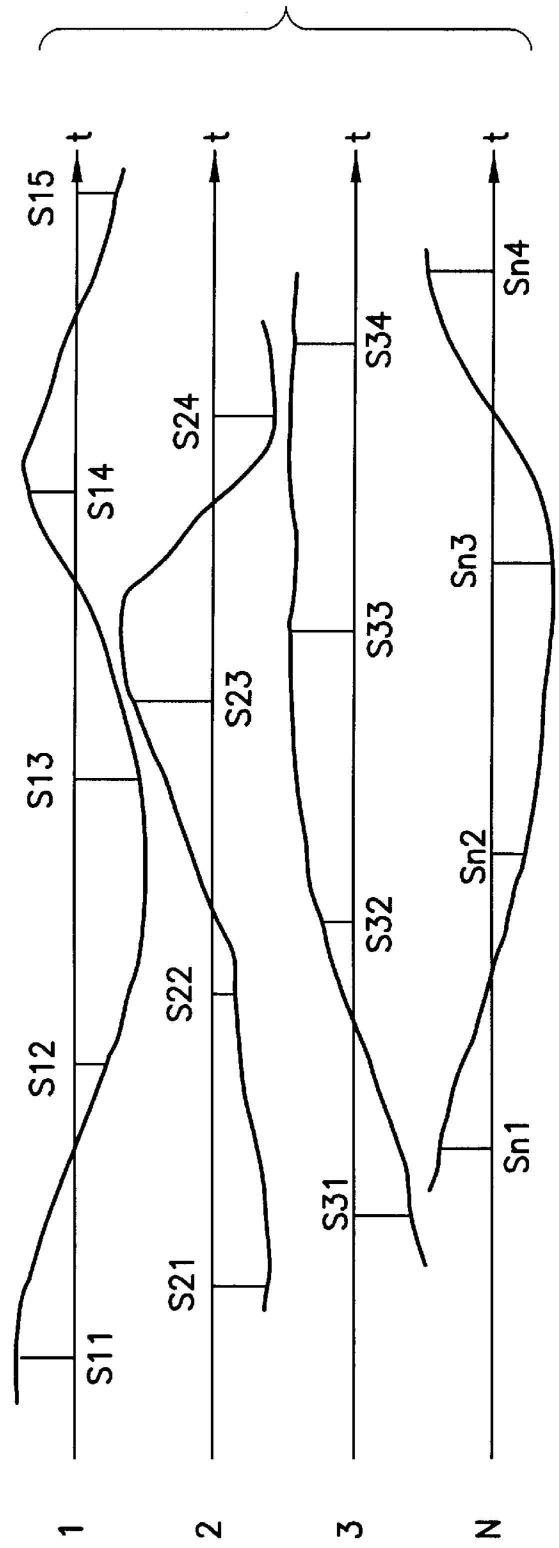
FIG. 3*a* is a schematic illustration of the signals from different sources in time.
Figure 3B:
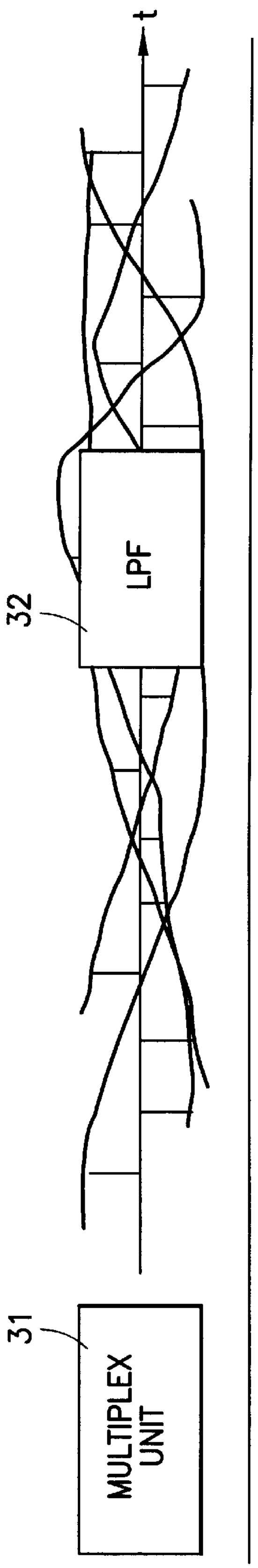
FIG. 3*b* is a schematic illustration of the time-offset aggregation and low-pass filtration of the input signals in FIG. 3*a;*

FIGS. 3*a* and 3*b* schematically illustrate the sequence of the method of the invention: FIG. 3*a* illustrates the time signals of N sources below each other, where the signals are identified by "S" followed by a figure for the source number, and another figure for the sampling value number inside of the next analog signal. The signals from N different sources are routed to the multiplex unit 31 which is schematically illustrated in FIG. 3*b*, where they are offset in time and superimposed on each other. The sampling values from the same source require an equidistant offset in time, while the signals from different sources need not be equidistantly offset in time if a filter installation or a DAC can manage a sufficiently high signal processing speed.

The resulting signal sequence at the output of the time-division multiplex unit 31 is routed to a normal low-pass filter 32 whose bandwidth B' corresponds to about half the sampling frequency $f_A$, so that the signals of each individual source can be reconstructed from the composite signal.

Figure 4:
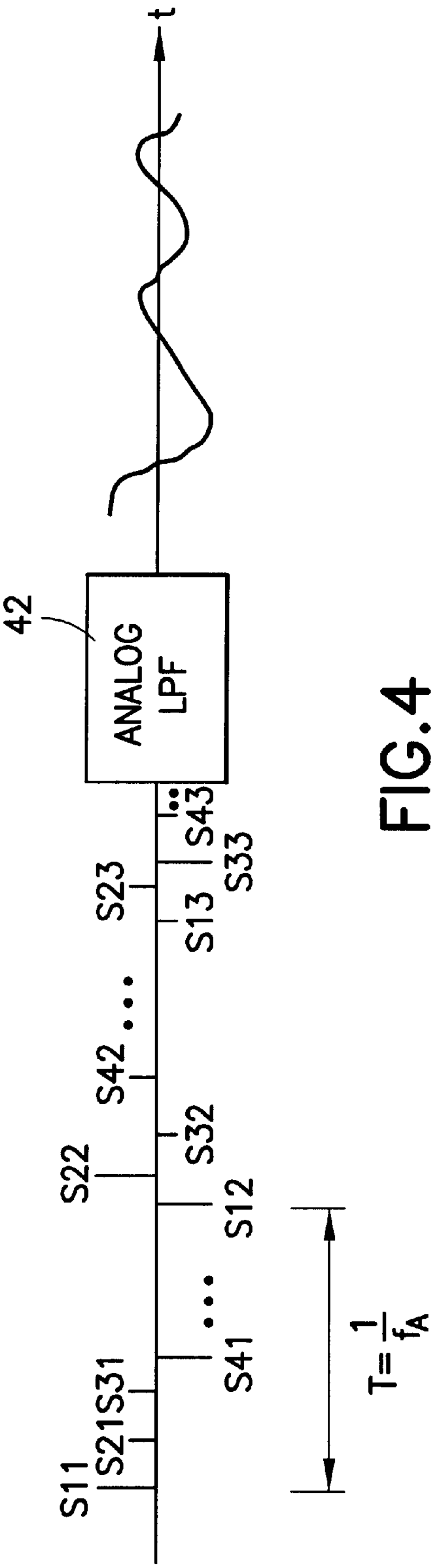
FIG. 4 is a schematic illustration of the time behavior of an aggregation according to the invention with analog input values.

FIG. 4 schematically illustrates the processing of sampling values from signals which are presently analog and originate from different sources, which are superimposed and offset in time in a time-division multiplex unit that is not illustrated further in FIG. 4, so that all the sampling values from all the other sources (S21 to SN1) are located between the first sampling value S11 from the first source and the second sampling value S12 from the first source. This sequence is routed to an analog low-pass filter 42 from which a corresponding continuous composite signal emerges in analog form.

Figure 5A:
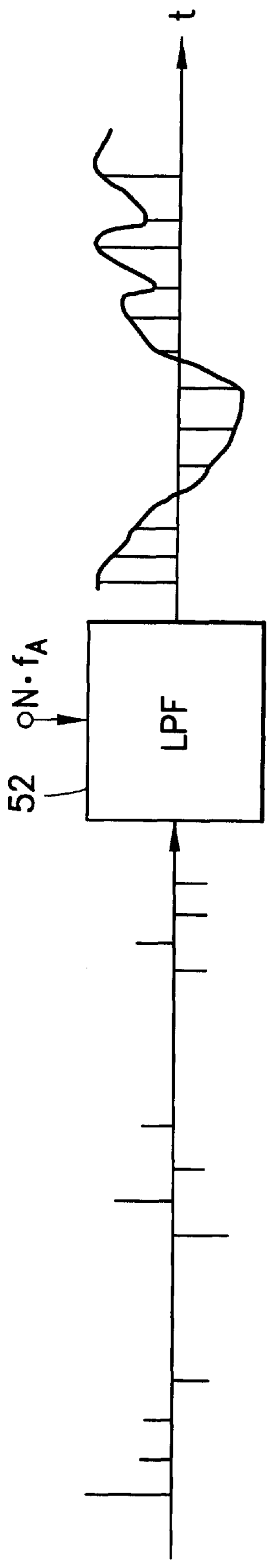
FIG. 5*a* is a schematic representation of the time behavior of the method of the invention during the summation of digital input values.
Figure 5B:
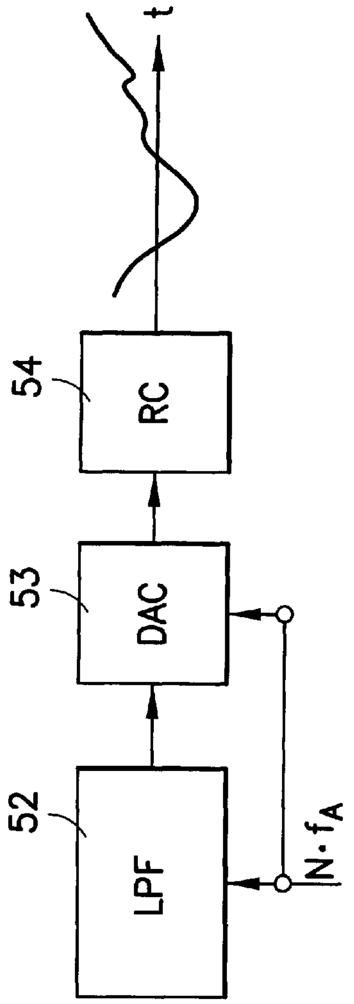
FIG. 5*b* is an improvement of the device in FIG. 5*a;*

FIG. 5*a* illustrates the same process with the input of digital sampling values. In this case the time-offset superimposed signals are again routed to a low-pass filter 52, which is a digital low-pass filter that is clocked at a frequency of $N \cdot f_A$. A composite signal with digital sampling values of the $N \cdot f_A$ frequency is created at the output of the low-pass filter 52 and, as illustrated in FIG. 5*b*, are routed to a DAC 53 which is also clocked at the $N \cdot f_A$ frequency. The output of the DAC 53 then contains analog sampling values with an $N \cdot f_A$ frequency which, because of the above described mode of operation of digital low-pass filters, must still undergo an analog low-pass filtration in an RC element 54.

If the time-flow of the digital sampling values is divided into equal blocks of n sampling values each, it is sufficient as a rule to keep the first respective sampling value of each block and to ignore the remaining sampling values (n−1). The sampling values selected by means of this so-called decimation procedure have a repetition frequency rate $f_A$ and also represent the desired composite signal exactly.

Figure 6:
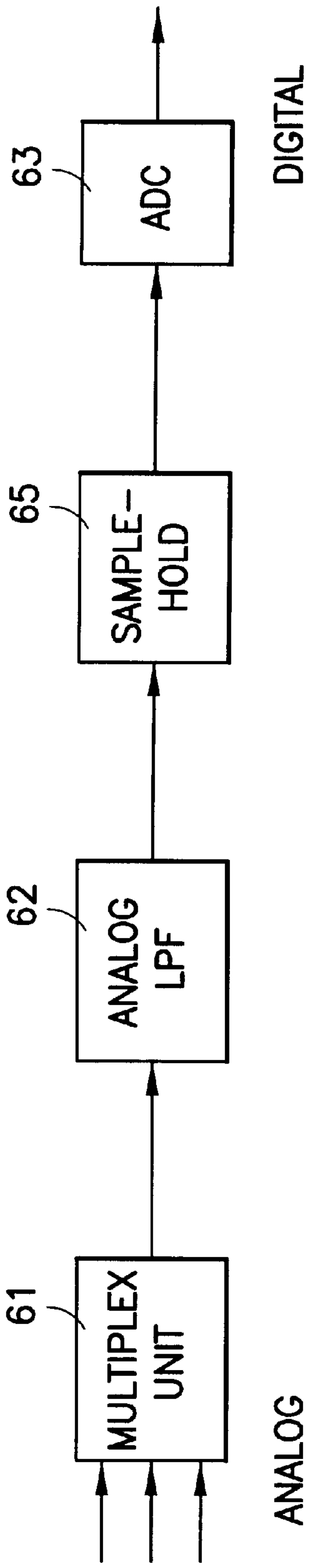
FIG. 6 is a schematic structure for forming an aggregation with an analog signal input and the possibility of a sampling rate conversion.

Inversely, an interpolation of sampling values can take place with the help of a so-called sampling rate conversion. FIG. 6 schematically illustrates how analog signals, which emerge offset in time and superimposed on each other from a time-division multiplex unit 61, are routed to an analog low-pass filter 62, whose output is provided with a sample-hold circuit 65. The latter in turn is connected to an analog-digital converter unit (ADC) 63, after which a digital processing of the signals becomes possible. To increase the sampling frequency for the sampling rate conversion, "zero values" are interpolatively inserted in areas in which no sampling values are present.

Figure 7:
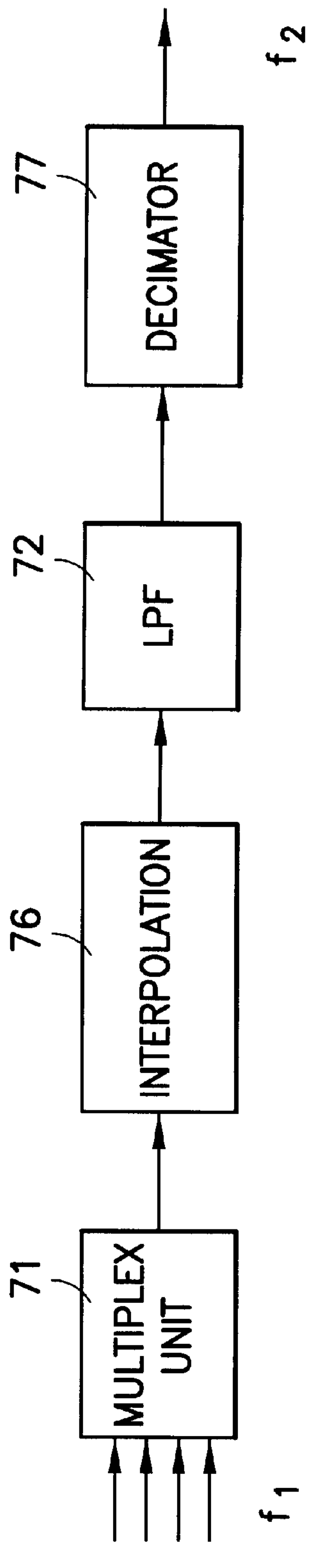
FIG. 7 is a schematic structure for carrying out the method of the invention with interpolation and/or decimation.

Finally FIG. 7 schematically illustrates a device according to the invention, with a time-division multiplex unit 71, an interpolation device 76 for inserting "zero values" and the corresponding sampling rate conversion, a low-pass filter 72 as well as a decimator 77 for the selective compaction of the signal data in accordance with the above described decimation procedure.

What is claimed is:

1. A method of forming an aggregation of N>1 band-limited time signals, each with a bandwidth ≦B, which are present as analog and/or digital sampling values, where the respective sampling frequency is $f_A>2B$, comprising the steps of:

1) offsetting in time and superimposing on each other the sampling values of all N time signals;

2) jointly routing the superimposed sampling values to a low-pass filter (12; 22; 32; 42; 52; 62; 72) with a bandwidth of B'>B;

3) tapping off a composite signal from the output of the low-pass filter (12; 22; 32; 42; 52; 62; 72).

2. A method as claimed in claim 1, wherein the sampling values of the N time signals are equidistantly offset in time with respect to each other.

3. A method as claimed in claim 2, further comprising inputting the offset in time sampling values into the low-pass filter (12; 22; 32; 42; 52; 62; 72) at a clock frequency of $N \cdot f_A$.

4. A method as claimed in claim 3, wherein an analog low-pass filter (11; 32; 42; 62) is used for analog sampling values and a time-continuous composite signal appears at its output.

5. A method as claimed in claim 4, wherein the analog sampling values of the composite signal are obtained from the time-continuous composite signal by means of sampling.

6. A method as claimed in claim 3, wherein a digital low-pass filter (12; 22; 52; 72) is used for digital sampling values, wherein the digital low-pass filter operates at the clock frequency of $n \cdot f_A$, and has a composite signal with $n \cdot f_A$ sampling values per unit of time at its output, i.e. in an oversampled form.

7. A method as claimed in claim 6, further comprising the step of routing the oversampled composite signal to a digital-analog (D/A) converter (23; 53) which operates at the clock frequency of $N \cdot f_A$, and whose output signal produces the time-continuous composite signal through subsequent filtration, preferably by means of an RC element (24; 54).

8. A method as claimed in claim 7, further comprising the step of transferring the oversampled composite signal to a lower sampling frequency $i \cdot f_A < N \cdot f_A$, where preferably i=1, by the periodic omission of sampling values (=decimation).

9. A method as claimed in 8, wherein the superimposing of sampling values and the lower sampling frequency of the composite signal are performed with a digital signal processor.

10. A method as claimed in claim 6, further comprising the step of transferring the oversampled composite signal to a lower sampling frequency $i \cdot f_A < N \cdot f_A$, where preferably i=1, by the periodic omission of sampling values (=decimation).

11. A method as claimed in 3, wherein the superimposing of sampling values and the lower sampling frequency of the composite signal are performed with a digital signal processor.

12. A method as claimed in claim 1, further comprising inputting the offset in time sampling values into the low-pass filter (12; 22; 32; 42; 52; 62; 72) at a clock frequency of $N \cdot f_A$.

13. A method as claimed in claim 12, wherein an analog low-pass filter (11; 32; 42; 62) is used for analog sampling values and a time-continuous composite signal appears at its output.

14. A method as claimed in 12, wherein the superimposing of sampling values and the lower sampling frequency of the composite signal are performed with a digital signal processor.

15. A method as claimed in claim 1, wherein an analog low-pass filter (11; 32; 42; 62) is used for analog sampling values and a time-continuous composite signal appears at its output.

16. A device for forming an aggregation of N>1 band-limited time signals, each with a bandwidth ≦B, which are present as analog and/or digital sampling values, where the respective sampling frequency is $f_A>2B$, comprising;

A) a time-division multiplex unit (11; 21; 31; 61; 71), wherein the sampling values of all N time signals are offset in time and superimposed on each other; and B) a low-pass filter (12; 22; 32; 42; 52; 62; 72) with a bandwidth of B'>B which is connected to the time-division multiplex unit (11; 21; 31; 61; 71), into which the offset in time and superimposed sampling values can be jointly input, the low-pass filter having an output so that a composite signal can be tapped off from its output.

* * * * *